United States Patent [19]

Hill

[11] Patent Number: 5,298,453
[45] Date of Patent: Mar. 29, 1994

[54] INTEGRATION OF EPITAXIAL STRUCTURES

[75] Inventor: Darrell Hill, Plano, Tex.

[73] Assignee: Texas Instruments Incorporated, Dallas, Tex.

[21] Appl. No.: 810,993

[22] Filed: Dec. 20, 1991

[51] Int. Cl.$^5$ .............................................. H01L 21/20
[52] U.S. Cl. ...................................... 437/89; 437/110; 437/126; 148/DIG. 11
[58] Field of Search .......... 437/89, 110, 126; 148/DIG. 11, DIG. 50, DIG. 160

[56] References Cited

U.S. PATENT DOCUMENTS 5,102,812  4/1992  Caneau et al. .

FOREIGN PATENT DOCUMENTS 1-186669  7/1989  Japan .

OTHER PUBLICATIONS

David B. Slater Jr., "Demonstration of a Monolithic NPN and PNP Complementary HBT Technology", SPIE-High-Speed Electronics and Device Scaling, pp. 90-105, vol. 1288, 1990.
W. E. Stanchina, et al., "InP Based Technology for Monolithic Multiple-Device, Multiple-Function ICs", GOMAC, pp 1-3, Paper No. 82, (date unknown).

Primary Examiner—George Fourson
Attorney, Agent, or Firm—Dana L. Burton; Richard A. Stoltz; James C. Kesterson

[57] ABSTRACT

This is method for forming epitaxial structures on a substrate which comprises: forming a first epi layer on the substrate; removing one or more substantial portions of the first epi layer; forming a second epi layer over the first epi layer and adjacent said first epi layer; forming a masking layer over portions of the second epi layer which are not over the first epi layer; and substantially removing a portion of the second epi layer which is over the first epi layer to provide a substantially planar structure having different properties. Other devices and methods are also disclosed.

18 Claims, 1 Drawing Sheet

INTEGRATION OF EPITAXIAL STRUCTURES

FIELD OF THE INVENTION

This invention generally relates to integration of epitaxial structures.

BACKGROUND OF THE INVENTION

As integrated circuits become more compact and more complicated monolithic integration becomes a necessity. However, many circuit applications require devices with incompatible epitaxial structures making monolithic integration difficult. Generally, methods for integrating these structures result in non-planar surface topography.

Attempts to solve the integration problems have included using non-epitaxial materials to form foreign cap layers during overgrowth. Many of these solutions require additional lithographic steps for removal of the unwanted material, result in non-planar topography, require selective overgrowth, or are device specific.

SUMMARY OF THE INVENTION

This is method for forming epitaxial structures on a substrate which comprises: forming a first epi layer on the substrate; removing one or more substantial portions of the first epi layer; forming a second epi layer over the first epi layer and adjacent said first epi layer; forming a masking layer over portions of the second epi layer which are not over the first epi layer; and substantially removing a portion of the second epi layer which is over the first epi layer to provide a substantially planar structure having different properties. Preferably, the substrate is GaAs; the first epi layer is AlGaAs or GaAs; the second epi layer is the same material as the first epi layer with a different dopant or a different material than the first epi layer; a first etchstop layer is formed after the first epi layer is formed or after removing one or more portions of the first epi layer; the first etchstop layer may also be formed as an upper portion of the first epi layer or as a lower portion of said second epi layer; the first etchstop layer is AlGaAs or InGaAs; a second etchstop layer is formed after the second epi layer is formed; the second etchstop layer may be formed as an upper portion of the second epi layer; forming the masking layer includes a planarization process and the planarization process is a polyimide etchback, or the masking layer is formed with a photolithography method. The second epi layer may also be Si.

This is also epitaxial structures on a substrate which comprise: a first epi structure over a portion of the substrate; and a second epi structure beside the first epi layer and over a portion of the substrate with a top surface of the first epi structure and the second epi structure being substantially planar and the structures having different properties. Preferably, the first epi structure is a portion of an NPN HBT and the second epi structure is a portion of a PNP HBT; or the first epi structure is a portion of an HBT and the second epi structure is a portion of a laser; or the first epi structure is a portion of an HBT and the second epi structure is a portion of a HEMT.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
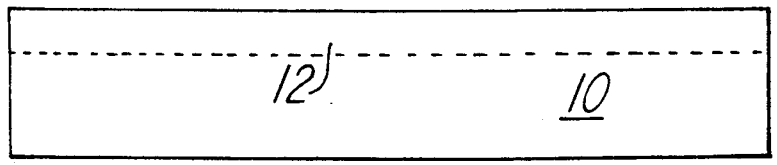
FIG. 1 is a first step of a preferred embodiment of this invention.

The present invention offers a technique to create planar monolithic integration of different epitaxial structures. This technique is particularly useful in the integration of GaAs/AlGaAs devices such as complementary HBTs, HBT-HEMT, and HBT-laser. This method may also be used to isolate HBT layers with very heavy doping by confining the necessary epitaxial structures to the active device region. This technique could also be used to create other types of monolithic circuits such as those combining GaAs devices and Si devices. Table 1 below may be referred to for clarification of the element numbers in the drawings.

Figure 2:
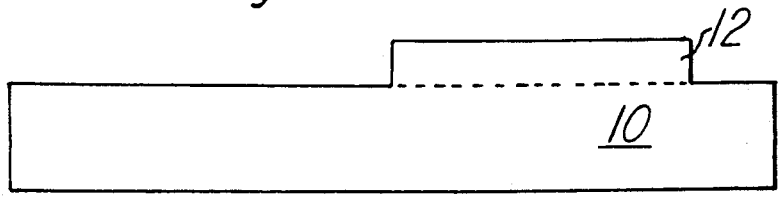
FIG. 2 is an second step of a preferred embodiment of this invention.
Figure 3:
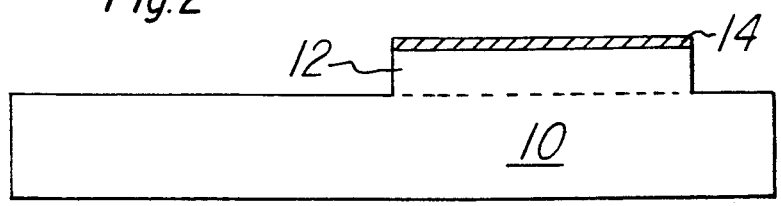
FIG. 3 is a step to be performed before or after the step of FIG. 2 in a first alternate embodiment.
Figure 4:
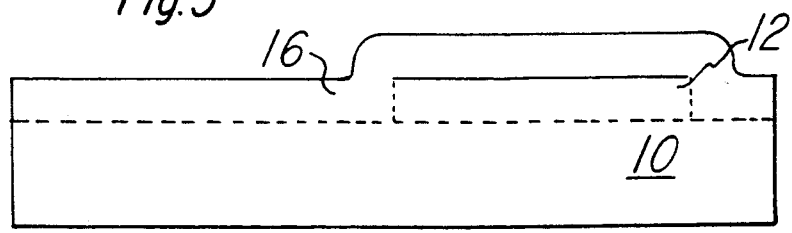
FIG. 4 is a third step of a preferred embodiment of this invention.
Figure 5:
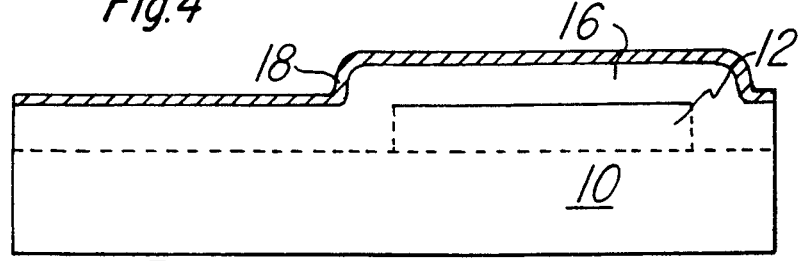
FIG. 5 is a step to be performed after the step of FIG. 4 in a second alternate embodiment.

In a preferred embodiment of the present invention, a first epi layer 12 is formed on a substrate 10, as shown in FIG. 1. As an example, the substrate 10 may be GaAs and the first epi layer 12 may be GaAs or AlGaAs. Referring to FIG. 2, the first epi layer 12 is then removed in the regions where the second device structure is desired. A wet or dry etch process may be used to remove the desired regions of first epi layer 12. In an alternate embodiment, shown in FIG. 3, a first etchstop layer 14 may be formed over the first epi layer 12. The first etchstop layer 14 may be either grown or deposited and may be formed either before or after the step shown in FIG. 2. Alternately, the first etchstop layer 14 may be incorporated as the final layer in the first epi layer 12 formation, in a single growth process, or the first etchstop layer 14 may be incorporated as the first layer in the second epi layer 16 formation. In this example, the first etchstop layer 14 may preferably be AlGaAs or InGaAs. The second epi layer 16 is formed over the first epi layer 12 or the first etchstop layer 14 depending on which embodiment is used, as shown in FIG. 4. The second epi layer 16 may be the same material as the first epi layer 12 with different doping or it may be an altogether different material. If desired a second etchstop layer 18 may be formed over the second epi layer 16, as shown in FIG. 5. The second etchstop layer 18 may be formed or grown in the same manner as the first etchstop layer 14. The second etchstop layer 18 may also, if desired, be incorporated as the final layer in the second epi layer 16 formation, in a single growth process. As an example, Molecular Beam Epitaxy (MBE) or Metalorganic Chemical Vapor Deposition (MOCVD) may be used to form the epi layers 12,16.

Figure 6:
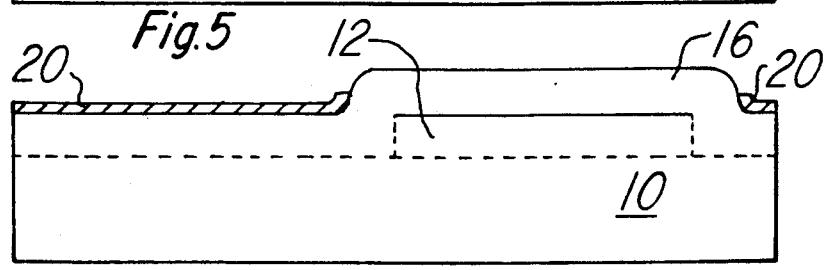
FIG. 6 is a fourth step of a preferred embodiment of this invention.
Figure 7:
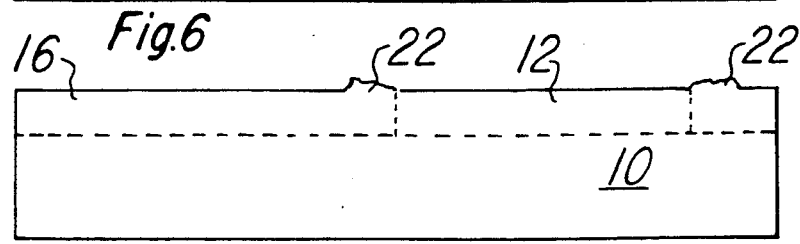
FIG. 7 is a fifth step of a preferred embodiment of this invention.

Preferably, a planarizing process is used to remove the second epi layer 16 in the areas over the remaining portions of the first epi layer 12. Referring to FIG. 6, a layer of planarizing material 20 is deposited over the second epi layer 16 or the second etchstop layer 18, depending on the embodiment chosen, and a planarization process such as a polyimide etch-back is performed. Alternately, if desired, a photolithography process could be used to create an etch mask (not shown). The second epi layer 16 is then removed in the areas over the first epi layer 12 leaving a structure like that shown in FIG. 7. An isotropic dry etch, such as Reactive Ion Etching (RIE), or a wet etch may be used to remove the desired portion of the second epi layer 16. The remaining planarizing material 20 is then selectively removed. The optional first and second etchstop layers 14,18 may be removed or used in further fabrication steps as desired. The etchstop layers 14,18 allow for easier and more selective etching. Preferably, etch processes are selected dependent on whether or not either or both of the etchstop layers 14,18 are used.

The resultant structure leaves a surface that is planar except for possibly at boundary regions 22. High yield has been demonstrated crossing the boundary regions between the epi layer growths 12,14, making this process useful for many integration applications.

The above example shows two device structures with two separate epi layers. However, this process could obviously be applied to make many side-by-side device structures with many different epi layers, as needed. This technique offers the advantages of being able to create entirely single crystal structures, requires no foreign cap layers, it is not device specific, and no selective overgrowth capability is required. This method may be used to create structures that are substantially planar and have different properties (e.g. different doping, different composition). It may also be used to avoid the damage resulting from processes such as implantation. This technique is very broadly applicable to anything requiring devices which use different epitaxial structures.

A preferred embodiment has been described in detail hereinabove. It is to be understood that the scope of the invention also comprehends embodiments different from those described, yet within the scope of the claims. For example, the materials used are dependent on the application, and any materials that are needed on the same monolithic substrate and may be epitaxially grown may be used. More specifically, for the example shown above, the AlGaAs could be replaced with any appropriate wide bandgap material such as InGaP or InAlAs and the GaAs could be replaced with a material such as InGaAs. Similarly, the number of side-by-side structures formed is essentially dependent only on the desired application. As is obvious, this is a technique with broad applications in the field of epitaxial growth and monolithic integration. Words of inclusion are to be interpreted as nonexhaustive in considering the scope of the invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

TABLE 1

| ELEMENT NUMBER | DESCRIPTION |
|---|---|
| 10 | SUBSTRATE |
| 12 | FIRST EPI LAYER |
| 14 | FIRST ETCHSTOP LAYER |
| 16 | SECOND EPI LAYER |
| 18 | SECOND ETCHSTOP LAYER |
| 20 | PLANARIZING LAYER |
| 22 | BOUNDARY REGIONS |

What is claimed is:

1. A method for forming epitaxial structures on a substrate comprising:
   a. forming a first epi layer on said substrate;
   b. removing one or more substantial portions of said first epi layer;
   c. forming a second epi layer over said first epi layer and adjacent said first epi layer;
   d. forming a masking layer over portions of said second epi layer which are not over said first epi layer; and
   e. substantially removing a portion of said second epi layer which is over said first epi layer to provide a substantially planar structure having different properties.

2. The method of claim 1, wherein said substrate is GaAs.

3. The method of claim 1, wherein said first epi layer is AlGaAs.

4. The method of claim 1, wherein said first epi layer is GaAs.

5. The method of claim 1, wherein said second epi layer is the same material as said first epi layer with a different dopant.

6. The method of claim 1, wherein said second epi layer is a different material than said first epi layer.

7. The method of claim 1, wherein a first etchstop layer is formed over said first epi layer before said second epi layer is formed.

8. The method of claim 1, wherein a first etchstop layer is formed as an upper portion of said first epi layer.

9. The method of claim 1, wherein a first etchstop layer is formed as a lower portion of said second epi layer.

10. The method of claim 1, wherein a first etchstop layer is formed over said first epi layer after removing one or more portions of said first epi layer.

11. The method of claim 7, wherein said first etchstop layer is AlGaAs.

12. The method of claim 7, wherein said first etchstop layer is InGaAs.

13. The method of claim 1, wherein a second etchstop layer is formed after said second epi layer is formed.

14. The method of claim 1, wherein a second etchstop layer is formed as an upper portion of said second epi layer.

15. The method of claim 1, wherein forming said masking layer includes a planarization process.

16. The method of claim 15, wherein said planarization process is a polyimide etch-back.

17. The method of claim 1, wherein said masking layer is formed with a photolithography method.

18. The method of claim 1, wherein said second epi layer is Si.

* * * * *